(12) United States Patent
Anai

(10) Patent No.: US 9,390,387 B2
(45) Date of Patent: Jul. 12, 2016

(54) VISUALIZATION TECHNIQUE OF FEASIBLE REGIONS

(75) Inventor: Hirokazu Anai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 399 days.

(21) Appl. No.: 13/413,712

(22) Filed: Mar. 7, 2012

(65) Prior Publication Data

US 2012/0239357 A1  Sep. 20, 2012

(30) Foreign Application Priority Data

Mar. 18, 2011 (JP) .................................. 2011-061103

(51) Int. Cl.
*G06F 7/60* (2006.01)
*G06Q 10/04* (2012.01)
*G06F 17/11* (2006.01)
*G06F 17/50* (2006.01)

(52) U.S. Cl.
CPC ................ *G06Q 10/04* (2013.01); *G06F 17/11* (2013.01); *G06F 17/5009* (2013.01)

(58) Field of Classification Search
CPC ......... G06F 17/50; G06F 17/10; G06F 19/12; G06F 17/5045; G06F 17/11; G06F 2217/08; G06F 2217/06; G06F 17/5036
USPC .......................................................... 703/2
See application file for complete search history.

(56) References Cited

U.S. PATENT DOCUMENTS

| | | | |
|---|---|---|---|
| 7,774,173 B2 * | 8/2010 | Orii et al. ........................... | 703/2 |
| 2005/0159935 A1 | 7/2005 | Orii et al. | |
| 2005/0257178 A1 * | 11/2005 | Daems ................ | G06F 17/5045 716/51 |
| 2007/0244574 A1 * | 10/2007 | Orii et al. ........................ | 700/31 |
| 2007/0260433 A1 * | 11/2007 | Seki .................... | G06F 17/5036 703/2 |
| 2009/0182538 A1 * | 7/2009 | Yanami et al. .................... | 703/2 |
| 2009/0182695 A1 | 7/2009 | Yanami et al. | |
| 2011/0022365 A1 * | 1/2011 | Iwane et al. ....................... | 703/2 |
| 2011/0112811 A1 * | 5/2011 | Matsumoto ............ | G06F 17/10 703/2 |

FOREIGN PATENT DOCUMENTS

| | | |
|---|---|---|
| JP | 7-056608 | 3/1995 |
| JP | 2005-129015 A | 5/2005 |

(Continued)

OTHER PUBLICATIONS

Saugata Basu("An Improved Algorithm for Quantifier Elimination Over Real Closed Fields",IEEE,1997).*

(Continued)

*Primary Examiner* — Omar Fernandez Rivas
*Assistant Examiner* — Iftekhar Khan
(74) *Attorney, Agent, or Firm* — Fujitsu Patent Center

(57) ABSTRACT

The disclosed method includes: generating, from model expressions, each representing a relationship between input parameters and output evaluation indicators and a range of residuals for each model expression, at least one of a first problem to calculate a region that can be feasible with the model expressions, value ranges of the input parameters and the range of the residuals for each model expression and a second problem to calculate a region that is always feasible with the model expressions, the value ranges of the input parameters and the influence of the aforementioned range; calculating a feasible region(s) for a generated problem(s) to obtain data of the feasible region(s); and generating visualization data of the feasible region(s) to output the visualization data.

12 Claims, 11 Drawing Sheets

(56) References Cited

FOREIGN PATENT DOCUMENTS

| | | |
|---|---|---|
| JP | 2007-272478 A | 10/2007 |
| JP | 2007-310873 | 11/2007 |
| JP | 2009-169558 A | 7/2009 |
| JP | 2010-033615 | 2/2010 |

OTHER PUBLICATIONS

David Monniaux("A Quantifier Elimination Algorithm for Linear Real Arithmetic",VERIMAG, Sep. 4, 2008).*

David Monniaux ("A Quantifier Elimination Algorithm for Linear Real Arithmetic",VERIMAG, Sep. 4, 2008).*

Saugata Basu ("An Improved Algorithm for Quantifier Elimination Over Real Closed Fields", IEEE,1997).*

Belair et al.("Quantifier Elimination in Valued Ore Modules", Fonds de la Rec.here.he Scientifique,2009, pp. 1-30.*

Anai, Hirokazu et al., "Introduction to Computational Real Algebraic Geometry", Mathematics Seminar, Nippon-Hyoron-sha Co., Series No. 1, vol. 554, pp. 64-70, Nov. 2007 (English Translation).

Anai, Hirokazu et al., "Introduction to Computational Real Algebraic Geometry", Mathematics Seminar, Nippon-Hyoron-sha Co., Series No. 2, vol. 555, pp. 75-81, Dec. 2007 (English Translation).

Anai, Hirokazu et al., "Introduction to Computational Real Algebraic Geometry", Mathematics Seminar, Nippon-Hyoron-sha Co., Series No. 3, vol. 556, pp. 76-83, Jan. 2008 (English Translation).

Anai, Hirokazu et al., "Introduction to Computational Real Algebraic Geometry", Mathematics Seminar, Nippon-Hyoron-sha Co., Series No. 4, vol. 558, pp. 79-85, Mar. 2008 (English Translation).

Anai, Hirokazu et al., "Introduction to Computational Real Algebraic Geometry", Mathematics Seminar, Nippon-Hyoron-sha Co., Series No. 5, vol. 559, pp. 82-89, Apr. 2008 (English Translation).

Anai, Hirokazu et al., "Design Technology Based on Symbolic Computation", Fujitsu, vol. 60, No. 5, pp. 514-521, Sep. 2009 (English Abstract).

Jirstrand, Mats, "Cylindrical Algebraic Decomposition—an Introduction", Department of Electrical Engineering, Linköping University, Linköping, Sweden, Oct. 18, 1995.

Japanese Office Action mailed Aug. 26, 2014 for corresponding Japanese Application No. 2011-061103, with Partial Translation, 6 pages.

* cited by examiner

| INPUT PARAMETER 1 | INPUT PARAMETER 2 | INPUT PARAMETER 3 | INPUT PARAMETER 4 | ... | INPUT PARAMETER n |
|---|---|---|---|---|---|
| 10 | 20 | 30 | 40 | ... | 50 |
| 50 | 60 | 70 | 80 | ... | 60 |
| ... | ... | ... | ... | ... | ... |

FIG.5

| NO. | INPUT PARAMETER 1 | INPUT PARAMETER 2 | ... | OUTPUT EVALUATION INDICATOR 1 MEASUREMENT VALUE | OUTPUT EVALUATION INDICATOR 2 MEASUREMENT VALUE | ... |
|---|---|---|---|---|---|---|
| 1 | 11 | 21 | ... | 93 | 103 | ... |
| 2 | 21 | 11 | ... | 63 | 53 | ... |
| ... | ... | ... | ... | ... | ... | ... |

FIG.6

| OUTPUT EVALUATION INDICATOR 1 | OUTPUT EVALUATION INDICATOR 2 | OUTPUT EVALUATION INDICATOR 3 | OUTPUT EVALUATION INDICATOR 4 | ... | OUTPUT EVALUATION INDICATOR m |
|---|---|---|---|---|---|
| 90 | 100 | 110 | 120 | ... | 300 |

FIG.8

| NO. | INPUT PARAMETER 1 | INPUT PARAMETER 2 | ... | OUTPUT EVALUATION INDICATOR 1 SIMULATION RESULT | OUTPUT EVALUATION INDICATOR 2 SIMULATION RESULT | ... |
|---|---|---|---|---|---|---|
| 1 | 10 | 20 | ... | 90 | 100 | ... |
| 2 | 20 | 10 | ... | 60 | 50 | ... |
| ... | ... | ... | ... | ... | ... | ... |

FIG.9

VISUALIZATION TECHNIQUE OF FEASIBLE REGIONS

CROSS-REFERENCE TO RELATED APPLICATIONS

This application is based upon and claims the benefit of priority of the prior Japanese Patent Application No. 2011-061103, filed on Mar. 18, 2011, the entire contents of which are incorporated herein by reference.

FIELD

This technique relates to a visualization technique of feasible regions.

BACKGROUND

Recently, the optimal design by computer simulations are widely conducted. The optimal design by the computer simulations, which is often conducted, is the optimal design by the numerical calculation. For example, as illustrated in FIG. 1, the horizontal axis represents a cost, and the vertical axis represents a performance, and it is presumed that a value closer to the origin is preferable for both of them. Then, relationships between the cost and the performance are obtained by the computer simulations, and as illustrated in FIG. 1, each point corresponding to one relationship can be plotted on the plane or space, which is mapped by the cost and the performance. Because a point that the cost is lower and the performance is better is preferable in FIG. 1, a point closer to the origin is selected as an optimized point. However, because the results of the computer simulations are obtained as discrete points, it is unknown whether or not feasible points exist between the points.

On the other hand, the optimal design by the computer simulations also includes an optimization method by the computer algebra. In this method, the computer simulations are carried out for various input parameter values to calculate output evaluation indicator values for each case. Then, as illustrated in FIG. 2, an approximate expression "a" that approximately expresses a relationship between the input parameter and the output evaluation indicator is calculated, and then, the optimization by the computer algebra is conducted based on this approximate expression "a". As a processing for this optimization, there is a case that an expression representing a relationship between the cost and the performance as illustrated in FIG. 3 is calculated from the obtained approximate expression and constraint conditions. However, conventionally, an error of the approximate expression is not considered, though the approximate expression is used.

Incidentally, as for the computer algebra, a technique, which is called a Quantifier Elimination (QE), is well-known. This technique is a technique for transforming an expression such as $\exists x\,(x^2+bx+c=0)$ to an equivalent expression in which a quantifier ($\exists$ and $\forall$) is eliminated such as $b^2-4c \geq 0$.

Specifically, the QE method is described in the following document. However, because a lot of documents for the QE method exist, useful documents other than the following document exist. This document is incorporated herein by reference.

Anai Hirokazu and Yokoyama Kazuhiro, "Introduction to Computational Real Algebraic Geometry", Mathematics Seminar, Nippon-Hyoron-sha Co., Ltd., "Series No. 1", Vol. 554, pp. 64-70, November, 2007, "Series No. 2", Vol. 555, pp. 75-81, December, 2007, "Series No. 3", Vol. 556, pp. 76-83, January, 2008, "Series No. 4", Vol. 558, pp. 79-85, March, 2008, "Series No. 5", Vol. 559, pp. 82-89, April, 2008.

Anai Hirokazu, Kaneko Junji, Yanami Hitoshi and Iwane Hidenao, "Design Technology Based on Symbolic Computation", FUJITSU, Vol. 60, No. 5, pp. 514-521, September, 2009.

Jirstrand Mats, "Cylindrical Algebraic Decomposition—an Introduction", Oct. 18, 1995.

Namely, there is no conventional technique for visualizing an error of a model to be processed in the computer algebra.

SUMMARY

A method relating to this technique includes: (A) first generating, from data of a plurality of model expressions, each representing a relationship between input parameters and output evaluation indicators, and data of a range of residuals for each of the plurality of model expressions, at least one of a first problem to calculate a first region that is capable of being feasible with the plurality of model expressions, value ranges of the input parameters and the range of the residuals for each of the plurality of model expressions and a second problem to calculate a second region that is always feasible with the plurality of model expressions, the value ranges of the input parameters and the influence of the range of the residuals for each of the plurality of model expressions; (B) causing a processing unit that calculates a feasible region by a quantifier elimination method to calculate a feasible region or regions for a generated problem or problems in the first generating to obtain data of the feasible region or regions; and (C) second generating visualization data of the data of the feasible region or regions to output the visualization data.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 5 is a diagram depicting an example of data stored in a first data storage unit;

FIG. 6 is a diagram depicting an example of data stored in a fourth data storage unit;

FIG. 8 is a diagram depicting an example of output evaluation indicator value sets;

FIG. 9 is a diagram depicting an example of data stored in a second data storage unit;

DESCRIPTION OF EMBODIMENTS

Figure 1:
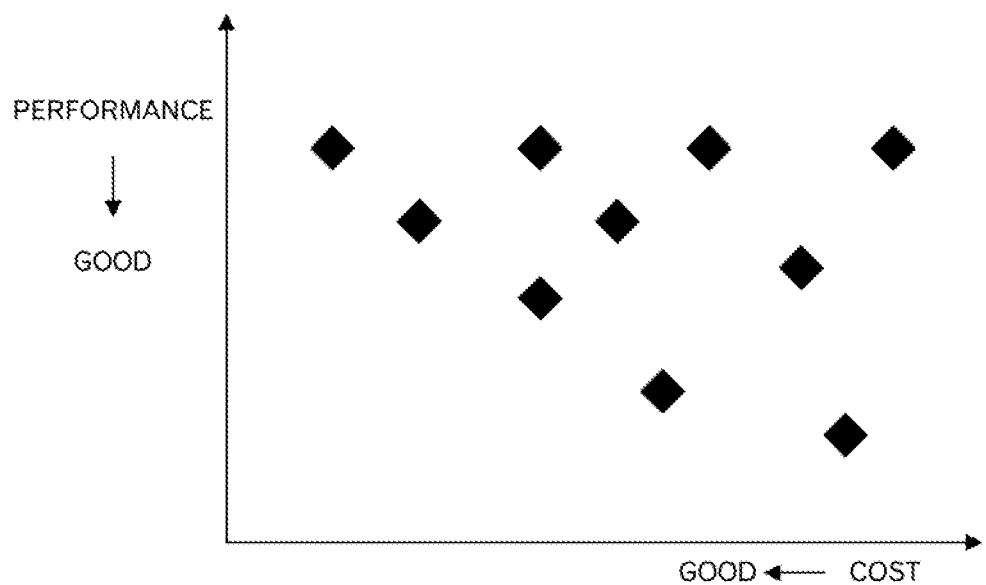
FIG. 1 is a diagram depicting an example of processing results by a numerical calculation.
Figure 2:
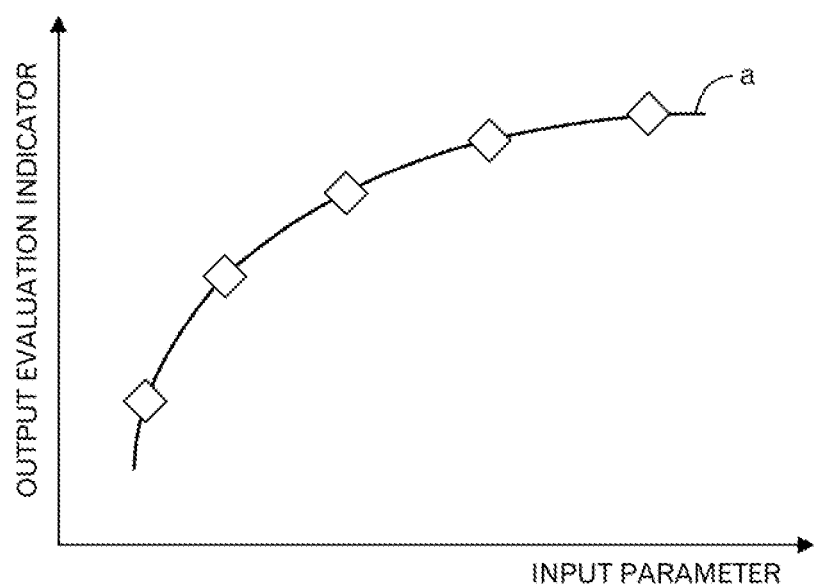
FIG. 2 is a diagram depicting an example of an approximate expression.
Figure 3:
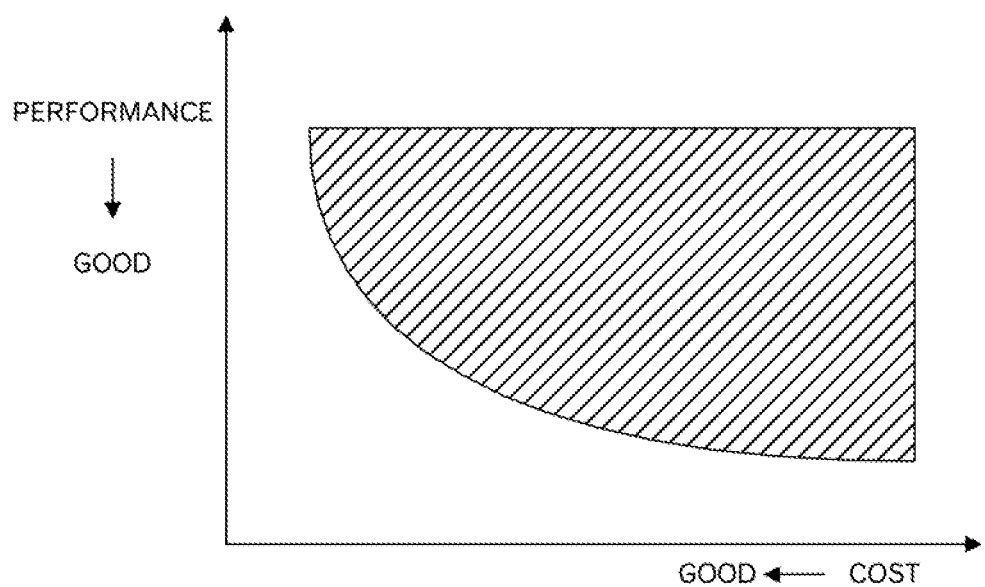
FIG. 3 is a diagram depicting an example of computer algebra.
Figure 4:
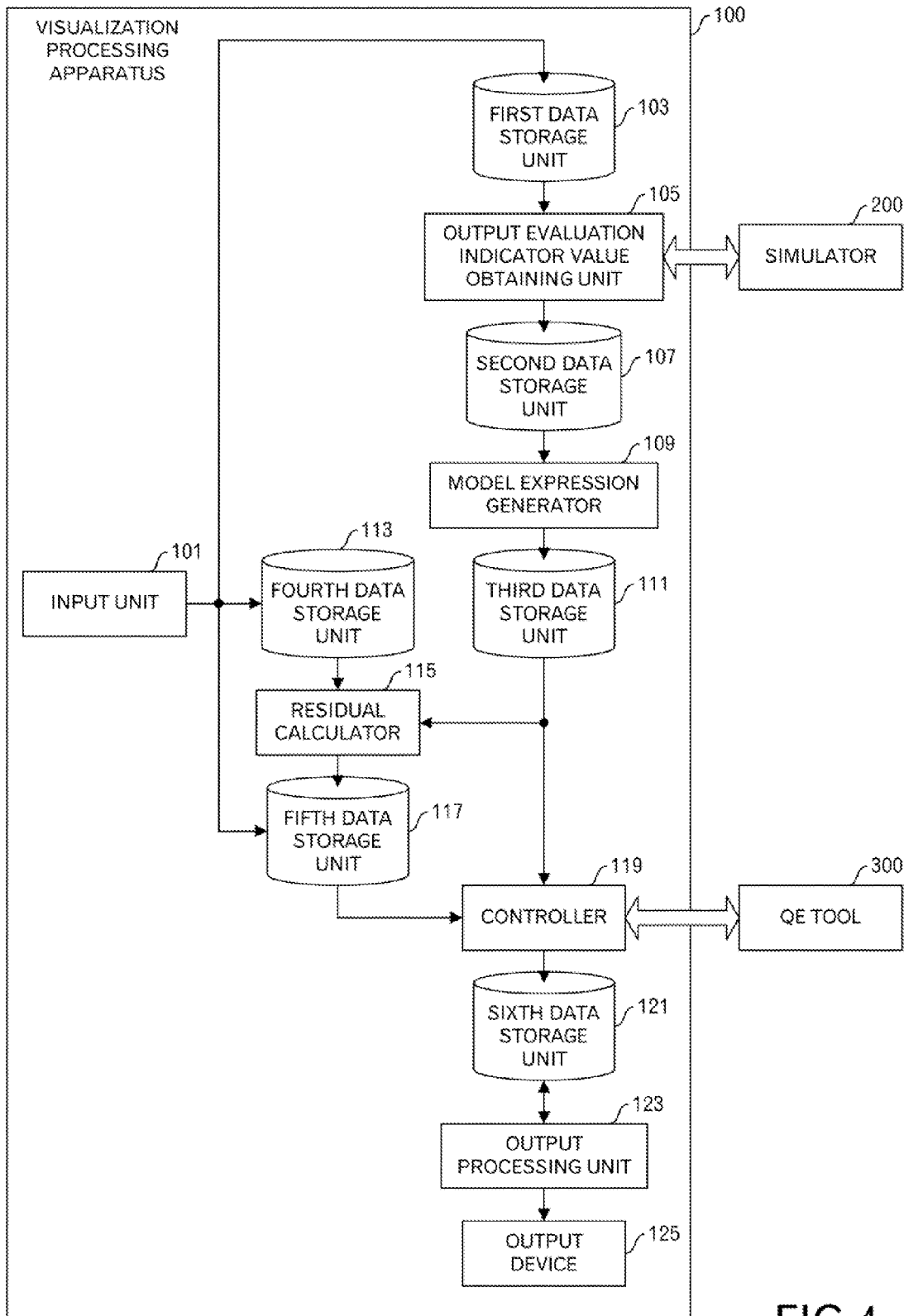
FIG. 4 is a functional block diagram of a visualization processing apparatus.

FIG. 4 illustrates a functional block diagram of a visualization processing apparatus relating to an embodiment of this technique. The visualization processing apparatus 100 includes an input unit 101, a first data storage unit 103, an output evaluation indicator value obtaining unit 105, a second data storage unit 107, a model expression generator 109, a third data storage unit 111, a fourth data storage unit 113, a residual calculator 115, a fifth data storage unit 117, a controller 119, a sixth data storage unit 121, an output processing unit 123, and an output device 125.

A simulator 200 carries out a predetermined processing for inputs of the input parameters to calculate an output evaluation indicator value, and outputs the calculated output evaluation indicator value. When the simulator 200 is a simulator for electrical circuits, the simulator 200 is a Simulation Program with Integrated Circuit Emphasis (SPICE) simulator, for example. However, the simulator 200 may be one of other simulators.

Moreover, a QE tool 300 is a module for carrying out a processing to transform an expression such as $\exists x \; (x^2+bx+c=0)$ to an equivalent expression in which the quantifier ($\exists$ and $\forall$) is eliminated such as $b^2-4c \geq 0$. The QE tool 300 is already known, therefore, further explanation is omitted.

The simulator 200 and QE tool 300 may be integrated into the visualization processing apparatus 100, and may be implemented in another computer connected through the network.

The input unit 101 stores input data according to instructions from a user into a first data storage unit 103, fourth data storage unit 113 or fifth data storage unit 117. The output evaluation indicator value obtaining unit 105 obtains the output evaluation indicator value from the simulator 200 by using data stored in the first data storage unit 103, and stores the obtained data into the second data storage unit 107. The model expression generator 109 carries out a processing by using data stored in the second data storage unit 107 and stores processing results into the third data storage unit 111. The residual calculator 115 carries out a processing by using data stored in the third data storage unit 111 and data stored in the fourth data storage unit 113, and stores processing results into the fifth data storage unit 117. The controller 119 causes the QE tool 300 to carry out a processing by using data stored in the fifth data storage unit 117 and third data storage unit 111, obtains data of a feasible region from the QE tool 300, and stores the obtained data into the sixth data storage unit 121. The output processing unit 123 generates visualization data by using data stored in the sixth data storage unit 121, and outputs the visualization data to the output device 125. The output device 125 may be a display device, printer or the like. Furthermore, the output device 125 may be one of other terminal apparatuses.

Incidentally, data may be directly inputted from the input unit 101 to the third data storage unit 111. Moreover, the input unit 101 may input instructions from the user into the respective processing units.

For example, data as illustrated in FIG. 5 is stored in the first data storage unit 103. In an example of FIG. 5, plural sets of input parameters 1 to n are stored. Such data may be inputted from the user through the input unit 101, or may be generated by any means automatically. In addition, data, which is generated in other computers or the like and is, for example, in a file format, may be stored in the first data storage unit 103 from the input unit 101.

For example, data as illustrated in FIG. 6 may be stored in the fourth data storage unit 113. In an example of FIG. 6, plural sets of values of the input parameters 1 to n and measurement values of the output evaluation indicators 1 to m are stored. For example, the output evaluation indicators may be performance and cost. Such data may be inputted from the user through the input unit 101, or data, which is generated in other computers and is, for example, in a file format, may be stored in the fourth data storage unit 113 from the input unit 101. Furthermore, as will be described below, when data is directly inputted into the fifth data storage unit 117, data may not be stored in the fourth data storage unit 113.

Figure 7:
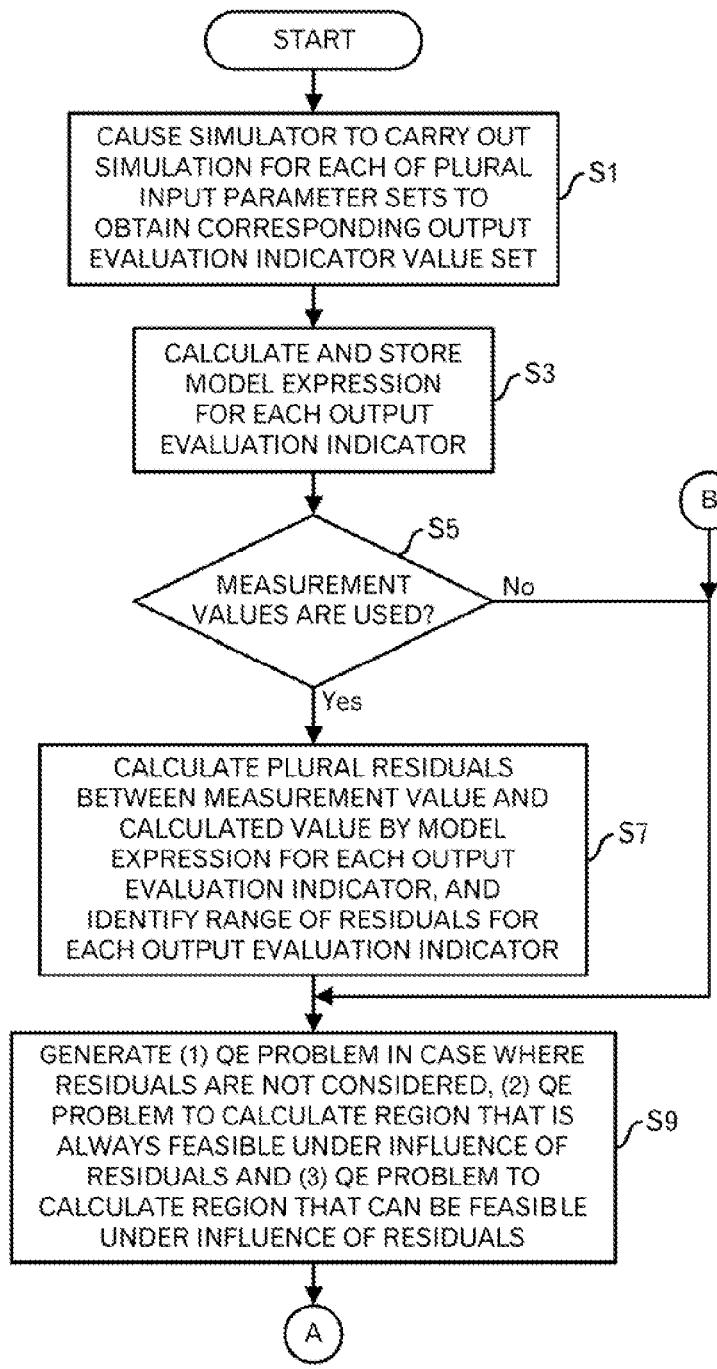
FIG. 7 is a diagram depicting a processing flow of the visualization processing apparatus.

Next, operations of the visualization processing apparatus 100 will be explained by using FIGS. 7 to 17. First, the output evaluation indicator value obtaining unit 105 outputs each of plural input parameter sets stored in the first data storage unit 103 to cause the simulator 200 to carry out a predetermined simulation, and obtains an output evaluation indicator value set corresponding to each of the input parameter set, and stores the obtained data into the second data storage unit 107 (FIG. 7: step S1). In an example of FIG. 5, the output evaluation indicator value obtaining unit 105 causes the simulator 200 to carry out the simulation for each input parameter set which is stored in one line of the table in FIG. 5, and obtains the output evaluation indicator value set (i.e. FIG. 8) including the values of the output evaluation indicators 1 to m from the simulator 200, and stores the obtained data in the second data storage unit 107 in association with the input parameter set. For example, data as illustrated in FIG. 9 is stored in the second data storage unit 107. In an example of FIG. 9, plural sets, each including a set of values of the input parameters 1 to n and a set of values of the output evaluation indicators 1 to m (i.e. simulation results), are stored.

Incidentally, although an example that the output evaluation indicator values are obtained by the simulation was explained above, the output evaluation indicator values may be obtained by the experimentation. In such a case, data is stored in the second data storage unit 107 from the user through the input unit 101.

Figure 10A:
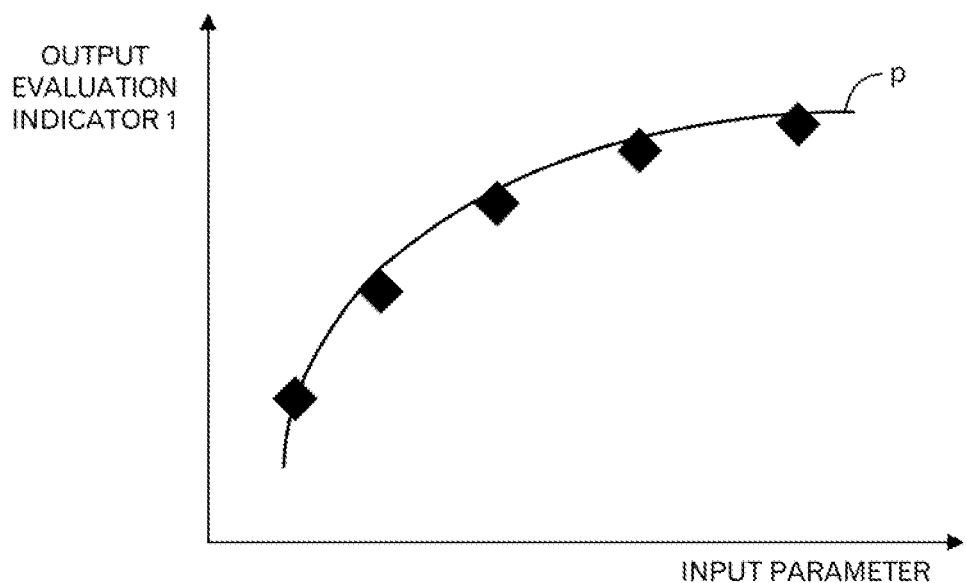
FIG. 10A is a schematic diagram depicting a relationship between an input parameter and an output evaluation indicator 1.
Figure 10B:
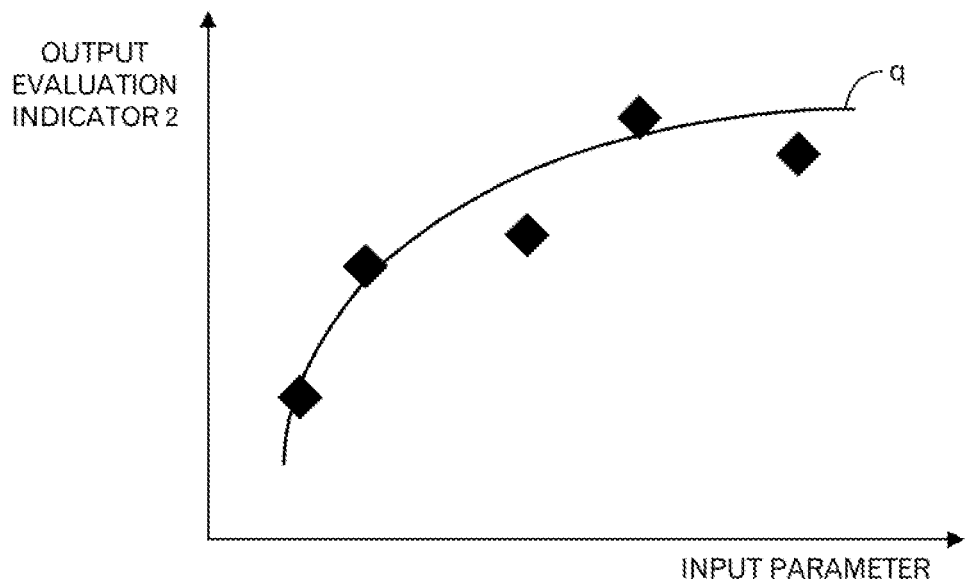
FIG. 10B is a schematic diagram depicting a relationship between an input parameter and an output evaluation indicator 2.

Next, the model expression generator 109 calculates a model expression for each of the output evaluation indicators by a method such as the least squares method, and stores data of the model expressions into the third data storage unit 111 (step S3). Schematically, as illustrated in FIG. 10A, diamond points, each representing a correspondence between the input parameter and the output evaluation indicator 1, are plotted in a space mapped by the input parameter and the output evaluation indicator 1 to calculate an approximate curve "p" of those points. Similarly, as illustrated in FIG. 10B, diamond points, each representing a correspondence between the input parameter and the output evaluation indicator 2, are plotted in a space mapped by the input parameter and the output evaluation indicator 2 to calculate an approximate curve "q" of those points. For the following explanation, it is presumed that a model expression represented as f=F(x, y) is obtained, wherein the input parameters are x and y and the output evaluation indicator 1 is f. Similarly, it is presumed that a model expression represented as g=G(x, y) is obtained, wherein the input parameters are x and y and the output evaluation indicator 2 is g.

Next, the residual calculator 115 determines based on the data stored in the fourth data storage unit 113 or an instruction from the user, whether or not the measurement values are used (step S5). When the measurement values are used, the residual calculator 115 identifies, for each of the output evaluation indicators, a range of the residuals by calculating plural residuals between the measurement value and a calculated value (also called a predicted value), and stores data of the range of the residuals into the fifth data storage unit 117 (step S7). Specifically, when data as illustrated in FIG. 6 is stored in the fourth data storage unit 113, the residual calculator 115 substitutes the values of the input parameters into the model expression stored in the third data storage unit 111 to calculate the values of the model expression. Then, the residual calculator 115 calculates the residuals between the calculated values and the measurement values of the output evaluation indicators, which correspond to the substituted input parameter values. As illustrated in FIG. 6, when plural data sets are prepared in advance and the same calculation is carried out, the range of the residuals is identified. Such a processing is carried out for each output evaluation indicator. Then, the processing shifts to step S9.

Figure 11:
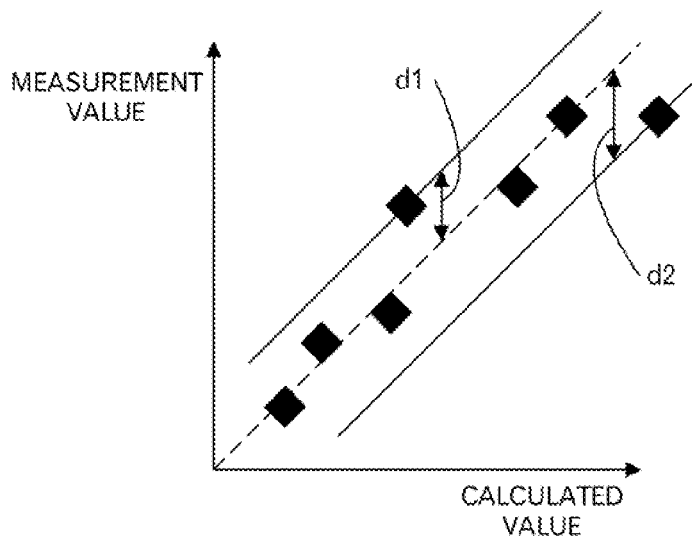
FIG. 11 is a diagram to explain a range of residuals.

The range of the residuals is schematically illustrated in FIG. 11. In FIG. 11, the horizontal axis represents the calculated value by the model expression, and the vertical axis represents the measurement value, and a diamond point represents a correspondence between the calculated value and the measurement value. In this diagram, a dotted line whose angle is 45 degrees is a line representing that the calculated value coincides with the measurement value, and the residual becomes 0. The points that are plotted apart from this line of 45 degrees upward have a positive residual, and the maximum value $r_1$ is identified among the positive residuals. Moreover, the points that are plotted apart from this line of 45 degrees downward have a negative residual, and the maximum value $r_2$ is identified among the negative residuals. Then, the range of the residuals $\delta$ is "$-r_2 \leq \delta \leq r_1$". In an example illustrated in FIGS. 10A and 10B, $-d_2 \leq \delta_f \leq d_1$ is calculated for the output evaluation indicator f, and $-e_2 \leq \delta_g \leq e_1$ is calculated for the output evaluation indicator g.

Incidentally, it is presumed that the model expressions into which these residuals are considered are represented as follows:

$$f_r = F(x,y) + \delta_f$$

$$g_r = G(x,y) + \delta_g$$

On the other hand, when the measurement values are not used, data of the range of the residuals has been stored in the fifth data storage unit 117 through the input unit 101. Therefore, the processing shifts to the step S9 without conducting the calculation of the range of the residuals.

Then, the controller 119 uses the data of the model expressions, which is stored in the third data storage unit 111, and data of the range of the residuals, which is stored in the fifth data storage unit 117, to generate (1) a QE problem in case that no residual is considered, (2) a QE problem to calculate a region which is always feasible under influence of the residuals, and (3) a QE problem to calculate a region which can be feasible under the influence of the residuals, and stores the generated data into a storage device such as a main memory (step S9).

Specifically, following expressions are generated.

Problem for (1)

$$\exists x \exists y [f - F(x,y) = 0 \; g - G(x,y) = 0 \psi(x,y)]$$

Namely, "$\exists$" that represents existence is attached to the input parameters x and y. Then, the model expression of each output evaluation indicator and the range of the input parameters $\psi(x, y)$ are coupled by " " as a condition. Incidentally, data set to the controller 119, for example, by the input unit 101 is used for $\psi(x, y)$. The data stored in advance in a storage device may be used. For example, the range of the input parameters $\psi(x, y)$ is "$0 \leq x \leq 2 \; 0 \leq y \leq 2$".

Problem for (2)

$$\exists x \exists y \forall \delta_f \forall \delta_g [(-d_2 \leq \delta_f \leq d_1 - e_2 \leq \delta_g \leq e_1) => f_r - F(x,y) - \delta_f = 0 \; g_r - G(x,y) - \delta_g = 0 \psi(x,y)]$$

Namely, "$\exists$" is attached to the input parameters x and y, and "$\forall$" that represents "all" is attached to the residuals $\delta_f$ and $\delta_g$. Then, a condition is defined that, if an expression that the ranges of the residuals are coupled by " " is satisfied, an expression that the model expression of each output evaluation indicator, which includes the influence of the residuals, and the ranges of the input parameters $\psi(x, y)$ are coupled by " " has come into effect.

Problem for (3)

$$\exists x \exists y \exists \delta_f \exists \delta_g [f_r - F(x,y) - \delta_f = 0 \; g_r - G(x,y) - \delta_g = 0 \psi(x,y) - d_2 \leq \delta_f \leq d_1 - e_2 \leq \delta_g \leq e_1]$$

Namely, "$\exists$" is attached to the input parameters x and y, and the residuals $\delta_f$ and $\delta_g$. Then, as a condition, the model expressions of each output evaluation indicator, which includes the influence of the residuals, the range of the input parameters $\psi(x, y)$ and the ranges of the residuals are coupled by " ".

The QE problems are generated in such a way. Here, it is presumed that a solution of (1) is represented as $\Phi(f, g)$, a solution of (2) is represented as $\Psi a(f, g)$, and a solution of (3) is represented as $\Psi p(f, g)$.

Figure 12:
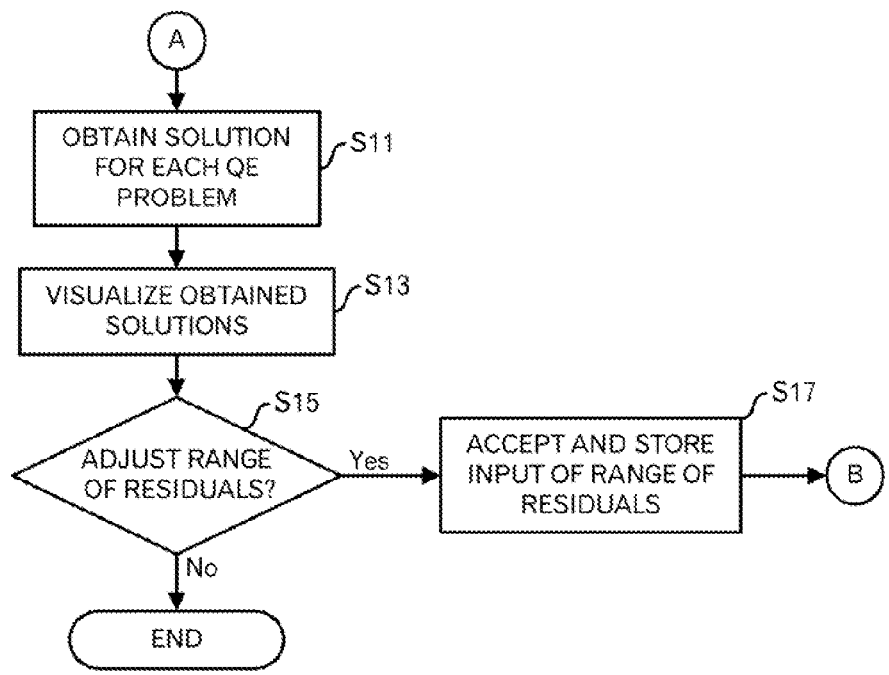
FIG. 12 is a diagram depicting a processing flow of the visualization processing apparatus.

Shifting to an explanation of a processing in FIG. 12 through terminal A, the controller 119 outputs the respective generated QE problems to the QE tool 300, causes the QE tool 300 to carry out a processing based on the quantifier elimination method, obtains the solutions from the QE tool 300, and stores the obtained solutions into the sixth data storage unit 121 (step S11). As described above, the solution $\Phi(f, g)$ of (1), solution $\Psi a(f, g)$ of (2) and solution $\Psi p(f, g)$ of (3) are obtained.

After that, the output processing unit 123 generates visualization data of the solutions stored in the sixth data storage unit 121, and outputs the visualization data to the output device 125 (step S13). In this embodiment, the visualization data to display the solution $\Phi(f, g)$ of (1), solution $\Psi a(f, g)$ of (2) and solution $\Psi p(f, g)$ of (3) in the superimposed form is generated.

Figure 13:
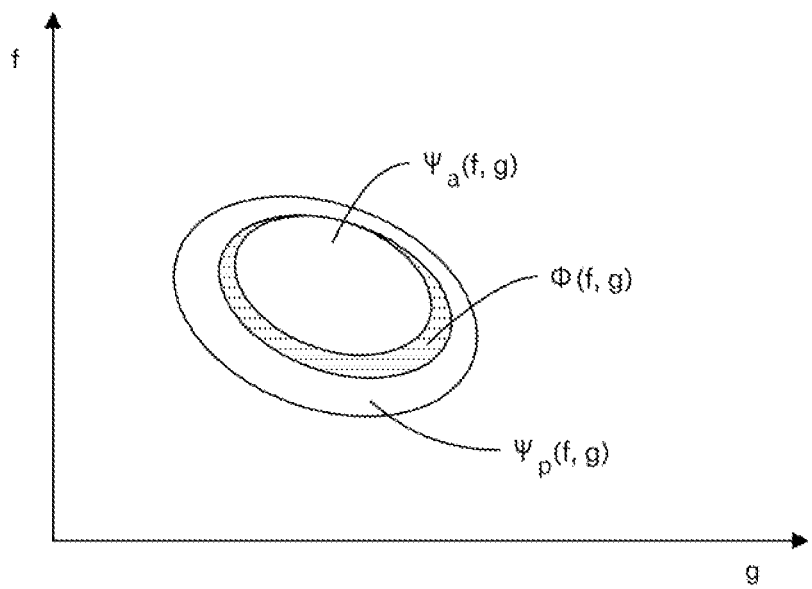
FIG. 13 is a diagram depicting an example of visualization data.

For example, data as illustrated in FIG. 13 is outputted to the output device 125. In an example of FIG. 13, the horizontal axis represents the output evaluation indicator g, and the vertical axis represents the output evaluation indicator f. Thus, typically, the range of the solution $\Psi p(f, g)$ of (3) is largest, the range of the solution $\Phi(f, g)$ of (1) is the second largest, and the range of the solution $\Psi a(f, g)$ of (2) is smallest. However, because how the regions are superimposed depends on the range of the residuals, it becomes possible for the user to grasp the influence of the residuals, by extension, the modeling error.

Figure 14:
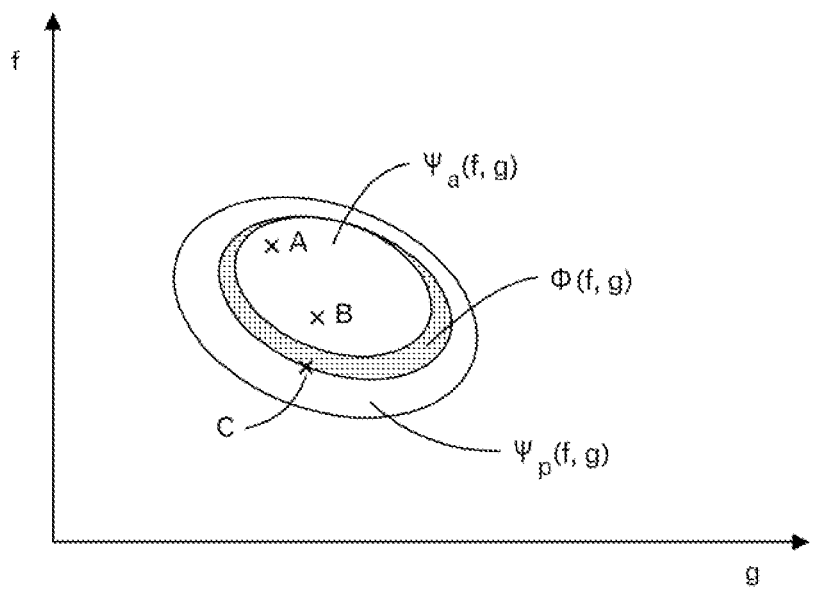
FIG. 14 is a diagram to explain application of the visualization data.

For example, when the result as illustrated in FIG. 13 is obtained, as illustrated in FIG. 14, the user may determine that a point around a point B is adopted in order to adopt the design that is robust against the modeling error, even if the residuals are considered. In addition, when a point that is around a point A, which represents a feasible point even if the residuals are considered is temporarily adopted, and the occurrence of any problem is confirmed by the verification by another verification method, it is possible to presume any problem other than the modeling error occurs. Furthermore, when a point around a point C is obtained after the optimization is carried out by the numeral calculation, it can be grasped that the performance up to this level cannot be expected actually.

Returning to the explanation of the processing, the input unit 101 determines whether or not an instruction to adjust the range of the residuals is inputted from the user (step S15). When the adjustment of the range of the residuals is not carried out, the processing ends. On the other hand, the adjustment of the range of the residuals is carried out, the input unit 101 accepts an input of the range of the residuals, and stores the input data into the fifth data storage unit 117 (step S17). Then, the processing returns to the step S9 through terminal B.

Figure 15:
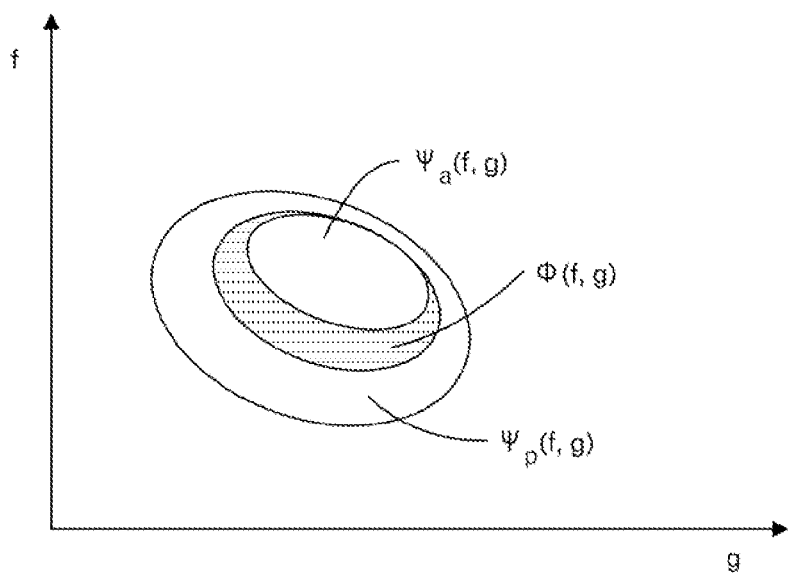
FIG. 15 is a diagram to explain adjustment of the range of the residuals.

Thus, the visualization data as illustrated in FIG. 15, for example, is next outputted. Here, when the range of the residuals is changed, for example, the region that is always feasible under the influence of the residuals becomes small, and the region that can be feasible under the influence of the residuals broadens. Thus, by adjusting the range of the residuals, the region of (3) and the region of (2) vary. Therefore, it becomes possible to grasp the influence of the residuals, quantitatively.

Furthermore, in order to achieve the target of the performance, a design method for improving the accuracy of the modeling and optimization stepwise can be realized. For example, after applying this method to a model in a lower order and narrowing the region satisfying a predetermined performance in the objective space (e.g. FIG. 13), data for modeling is acquired within a region in the parameter space, which corresponds to the detected region in the objective space to enhance the accuracy of the modeling. Then, this method is further applied. According to this processing, the accuracy and performance are improved, while the calculation time at each stage is also reduced by the hierarchical approach.

Furthermore, by generating plural model expressions, carrying out the aforementioned processing for the plural model expressions, and visualizing the feasible regions cumulatively, the modeling error may further be grasped. Incidentally, an example that the number of output evaluation indicators is 2 was described above. However, the feasible regions may be displayed for three output evaluation indicators.

Furthermore, the feasible region may be separately displayed without superimposing. For example, in response to a user's instruction, any one of the feasible regions may be displayed, or a combination of two or more arbitrary regions may be displayed.

Next, a specific example will be explained by using FIGS. 16 and 17. Here, it is presumed that the following model expressions are obtained.

$$f = F(x,y) = x^2 + y^2$$

$$g = G(x,y) = x^2 + y^2 - 2x + 1$$

The ranges of the input parameters are as follows:

$$0 \le x \le 2 \quad 0 \le y \le 2$$

Then, the ranges of the residuals are as follows:

$$-1/10 \le \delta_f \le 1/10$$

$$-1/10 \le \delta_g \le 1/10$$

Then, the following QE problems are obtained.
In case of (1)

$$\exists x \exists y [f - F(x,y) = 0 \; g - G(x,y) = 0 \; 0 \le x \le 2 \; 0 \le y \le 2]$$

In case of (2)

$$\exists x \exists y \forall \delta_f \forall \delta_g [(-1/10 \le \delta_f \le 1/10, -1/10 \le \delta_g \le 1/10) => f_r - F(x,y) - \delta_f = 0 \; g_r - G(x,y) - \delta_g = 0 \; 0 \le x \le 2 \; 0 \le y \le 2]$$

In case of (3)

$$\exists x \exists y \exists \delta_f \exists \delta_g [f_r - F(x,y) - \delta_f = 0 \; g_r - G(x,y) - \delta_g = 0 \; 0 \le x \le 2 \; 0 \le y \le 2 - 1/10 \le \delta_f \le 1/10 - 1/10 \le \delta_g \le 1/10]$$

Then, the solution $\Phi(f, g)$ of (1), solution $\Psi a(f, g)$ of (2) and solution $\Psi p(f, g)$ of (3) are as follows:

The solution $\Phi(f, g)$ of (1)

$(g == 0 \&\& f == 1) \| (0 < g \le 1 \&\& 1 - 2\sqrt{g} + g \le f \le 1 + 2\sqrt{g} + g) \| (1 < g \le 4 \&\& -1 + g \le f \le 3 + g) \| (4 < g < 5 \%\% (-1 + g \le f \le 1 - 2\sqrt{-4+g} + g \| 1 + 2\sqrt{-4+g} + g \le f \le 3 + g)) \| (g == 5 \&\& (f == 4 \| f == 8))$ The solution $\Psi a(f, g)$ of (2)

$$\left( f == \frac{1}{10} \&\& g == \frac{11}{10} \right)$$

$$\left\| \left( \frac{1}{10} < f \le \frac{39}{10} \&\& 1 + f - \sqrt{\frac{2}{5}} \sqrt{-1 + 10f} \le g \le 1 + f \right) \right\|$$

$$\left( \frac{39}{10} < f \le \frac{41}{10} \&\& \right.$$

$$\left. 1 + f - \sqrt{\frac{2}{5}} \sqrt{-1 + 10f} \le g \le 1 + f - \sqrt{\frac{2}{5}} \sqrt{-39 + 10f} \right)$$

$$\left\| \left( \frac{41}{10} < f < \frac{79}{10} \&\& -3 + f \le g \le 1 + f - \sqrt{\frac{2}{5}} \sqrt{-39 + 10f} \right) \right\|$$

$$\left( f == \frac{79}{10} \&\& g == \frac{49}{10} \right)$$

The solution $\Psi p(f, g)$ of (3)

$$\left( g == -\frac{1}{10} \&\& f == \frac{9}{10} \right) \left\| \left( -\frac{1}{10} < g \le \frac{9}{10} \&\& \right. \right.$$

$$\left. 1 + g - \sqrt{\frac{2}{5}} \sqrt{1 + 10g} \le f \le 1 + g + \sqrt{\frac{2}{5}} \sqrt{1 + 10g} \right) \right\|$$

$$\left( \frac{9}{10} < g \le \frac{41}{10} \&\& -1 + g \le f \le 3 + g \right)$$

$$\left\| \left( \frac{41}{10} < g < \frac{51}{10} \&\& \left( -1 + g \le f \le 1 + g - \sqrt{\frac{2}{5}} \sqrt{-41 + 10g} \right\| 1 + \right. \right.$$

$$\left. \left. g + \sqrt{\frac{2}{5}} \sqrt{-41 + 10g} \le f \le 3 + g \right) \right) \right\|$$

$$\left( g == \frac{51}{10} \&\& \left( f == \frac{41}{10} \| f == \frac{81}{10} \right) \right)$$

Figure 16:
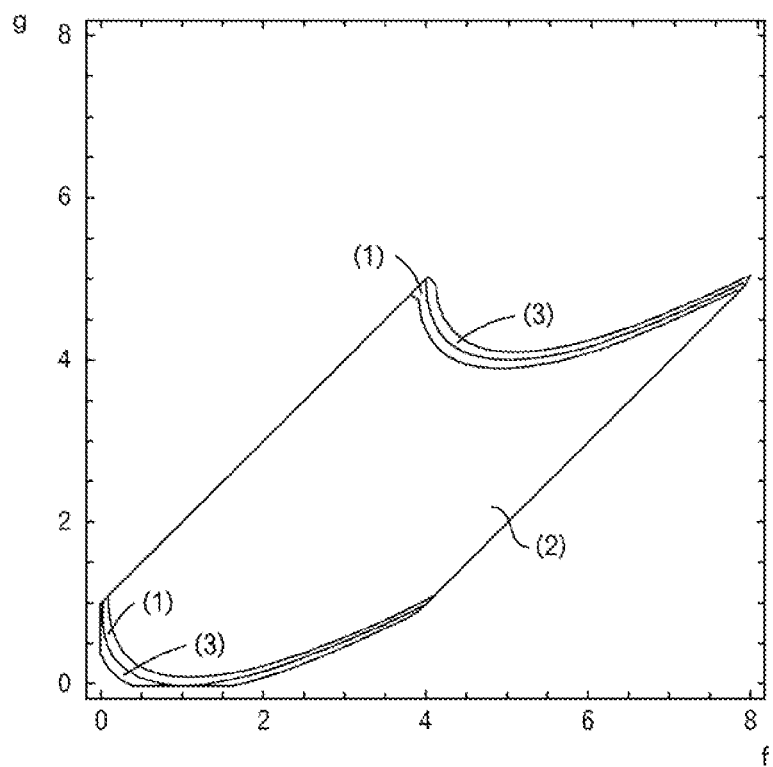
FIG. 16 is a diagram depicting a specific example of the visualization data.
Figure 17:
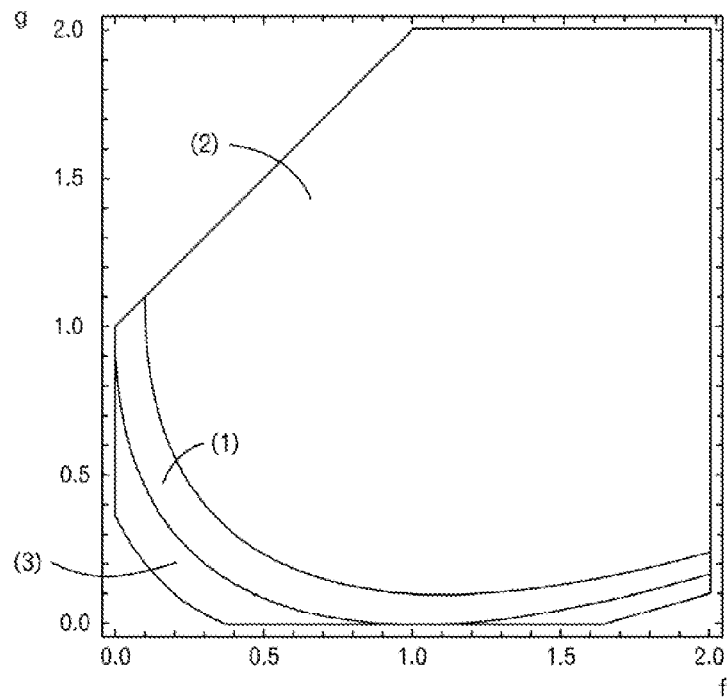
FIG. 17 is a diagram depicting a specific example of the visualization data.

When such solutions are visualized, an entire diagram illustrated in FIG. 16 is obtained. In an example of FIG. 16, the horizontal axis represents the output evaluation indicator f, and the vertical axis represents the output evaluation indicator g. In the oblique long and narrow region, the difference among (1) to (3) appears in upper portion and lower portion. Namely, the broadest region is the region of (3), the smallest region is the region (2), and the region of (1) lies between the region of (3) and the region of (2). In this graph, when the region of $0 \leq f \leq 2$ and $0 \leq g \leq 2$ is expanded, the visualization result as illustrated in FIG. 17 is obtained. Thus, it becomes possible to easily grasp the difference of the shapes in the area near the origin.

Although the embodiment of this technique was explained above, this technique is not limited to this embodiment. For example, the functional block diagram illustrated in FIG. 4 is a mere example, and does not always correspond to an actual program module configuration. In addition, the data storage mode described above is a mere example.

Furthermore, as for the processing flow, as long as the processing result does not change, the order of the processing may be changed, and the steps may be executed in parallel. In addition, a result obtained by reflecting the range of the residuals, which is calculated based on the measurement values, later, instead of "first", may be displayed. Specifically, first, the steps S17 and S9 may be carried out, then the steps S7 and S9 may be carried out.

In addition, although an example that the visualization processing apparatus is implemented by a stand-alone type computer was explained, the aforementioned processing may be carried out by plural computers connected with the computer network.

Figure 18:
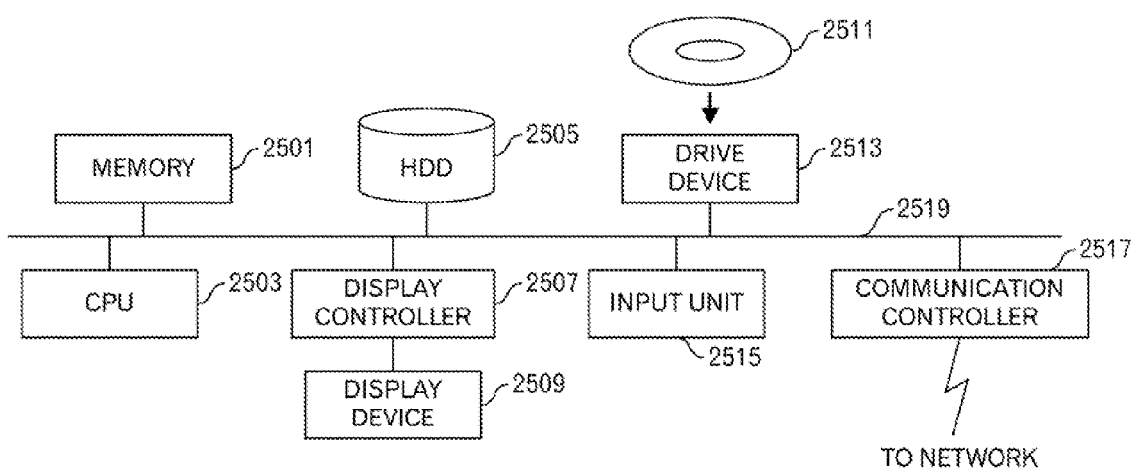
FIG. 18 is a functional block diagram of a computer.

In addition, the aforementioned visualization processing apparatus is a computer device as shown in FIG. 18. That is, a memory 2501 (storage device) a CPU 2503 (processor), a hard disk drive (HDD) 2505, a display controller 2507 connected to a display device 2509, a drive device 2513 for a removable disk 2511, an input device 2515, and a communication controller 2517 for connection with a network are connected through a bus 2519 as shown in FIG. 18. An operating system (OS) and an application program for carrying out the foregoing processing in the embodiment, are stored in the HDD 2505, and when executed by the CPU 2503, they are read out from the HDD 2505 to the memory 2501. As the need arises, the CPU 2503 controls the display controller 2507, the communication controller 2517, and the drive device 2513, and causes them to perform necessary operations. Besides, intermediate processing data is stored in the memory 2501, and if necessary, it is stored in the HDD 2505. In this embodiment of this technique, the application program to realize the aforementioned functions is stored in the computer-readable, non-transitory removable disk 2511 and distributed, and then it is installed into the HDD 2505 from the drive device 2513. It may be installed into the HDD 2505 via the network such as the Internet and the communication controller 2517. In the computer as stated above, the hardware such as the CPU 2503 and the memory 2501, the OS and the necessary application programs systematically cooperate with each other, so that various functions as described above in details are realized.

The aforementioned embodiment is summarized as follows:

A visualization processing method according to this embodiment includes: (A) first generating, from data of a plurality of model expressions, each representing a relationship between input parameters and output evaluation indicators, and data of a range of residuals for each of the plurality of model expressions, at least one of a first problem to calculate a first region that is capable of being feasible with the plurality of model expressions, value ranges of the input parameters and the range of the residuals for each of the plurality of model expressions and a second problem to calculate a second region that is always feasible with the plurality of model expressions, the value ranges of the input parameters and the influence of the range of the residuals for each of the plurality of model expressions, wherein the data of the plurality of model expressions is stored in a first data storage unit, and the data of the range of the residuals is stored in a second data storage unit; (B) causing a processing unit that calculates a feasible region by a quantifier elimination method to calculate a feasible region or regions for a generated problem or problems in the first generating to obtain data of the feasible region or regions; and (C) second generating visualization data of the data of the feasible region or regions to output the visualization data.

By carrying out such a processing, the modeling error which appears in the residuals can be grasped by the feasible region or regions. Incidentally, two or more regions may be simultaneously displayed or separately displayed.

Moreover, the aforementioned visualization method may include (D) generating, from the data of the plurality of model expressions, a third problem to calculate a third region that is feasible with the plurality of model expressions and the value ranges of the input parameters; (E) causing the processing unit to calculate a feasible region for the third problem to obtain data of the feasible region for the third problem. In such a case, the second generating may include generating visualization data to display superimposed feasible regions, from the data of the feasible regions. The modeling error can easily be grasped by this processing.

Furthermore, the aforementioned visualization processing method may further include: (F) calculating values of the output evaluation indicators by substituting specific values of the input parameters into each of the plurality of model expressions, wherein the measurement value of the output evaluation indicators are stored in a third data storage unit in association with the specific values of the input parameters; and (G) identifying, for each of the plurality of model expressions, the range of the residuals by calculating residuals between measurement values of the output evaluation indicators for the specific values of the input parameters and the calculated values of the output evaluation indicators, and storing the identified range of the residuals into the second data storage unit. Thus, the range of the residuals may be grasped based on the measurement values. By doing so, the error between values from an actual apparatus and values from the model can be grasped.

Furthermore, the aforementioned visualization processing method may further include: (H) accepting an input of the data of the residuals from a user, and storing the inputted data into the second data storage unit. Thus, by designating the error presumed in the model expressions in a form of the range of the residuals, problems can be visualized.

Incidentally, it is possible to create a program causing a computer to execute the aforementioned processing, and such a program is stored in a computer readable storage medium or storage device such as a flexible disk, CD-ROM, DVD-ROM, magneto-optic disk, a semiconductor memory, and hard disk. In addition, the intermediate processing result is temporarily stored in a storage device such as a main memory or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A computer-readable, non-transitory storage medium storing a program for causing a computer to execute a process, the process comprising:

first generating, from data of a plurality of model expressions, each including a residual term and representing a relationship between input parameters and output evaluation indicators, and data of a range of the residual term for each of the plurality of model expressions, a first problem to calculate a first region that is capable of being feasible with the plurality of model expressions, value ranges of the input parameters and the range of the residual term for each of the plurality of model expressions and a second problem to calculate a second region that is always feasible with the plurality of model expressions, the value ranges of the input parameters and influence of the range of the residual term for each of the plurality of model expressions, wherein the range of the residual term is a range of residuals for values of the output evaluation indicators, which are calculated by a model expression including the residual term;

first causing a processing unit configured to calculate a feasible region by a quantifier elimination method to calculate a first feasible region for the first problem and a second feasible region for the second problem to obtain first data of the first feasible region and second data of the second feasible region;

superimposing the first feasible region and the second feasible region based on the first data and the second data; and displaying, on a display device, the first feasible region and the second feasible region which have been superimposed.

2. The computer-readable, non-transitory storage medium as set forth in claim 1, wherein the process further comprises:

second generating, from the data of the plurality of model expressions, a third problem to calculate a third region that is feasible with the plurality of model expressions and the value ranges of the input parameters; and second causing the processing unit to calculate a third feasible region for the third problem to obtain third data of the third feasible region, the superimposing comprises superimposing the first feasible region, the second feasible region and the third feasible region based on the first data, the second data and the third data, and the displaying comprises displaying, on the display device, the first feasible region, the second feasible region and the third feasible region which have been superimposed.

3. The computer-readable, non-transitory storage medium as set forth in claim 1, wherein the process further comprises:

calculating the values of the output evaluation indicators by substituting specific values of the input parameters into each of the plurality of model expressions; and identifying, for each of the plurality of model expressions, the range of the residual term by calculating residuals between measurement values of the output evaluation indicators for the specific values of the input parameters and the calculated values of the output evaluation indicators.

4. The computer-readable, non-transitory storage medium as set forth in claim 1, wherein the process further comprises accepting an input of the data of the range of the residual term from a user.

5. A method of visualizing a feasible region, comprising:

first generating, by using a computer, from data of a plurality of model expressions, each including a residual term and representing a relationship between input parameters and output evaluation indicators, and data of a range of the residual term for each of the plurality of model expressions, a first problem to calculate a first region that is capable of being feasible with the plurality of model expressions, value ranges of the input parameters and the range of the residual term for each of the plurality of model expressions and a second problem to calculate a second region that is always feasible with the plurality of model expressions, the value ranges of the input parameters and influence of the range of the residual term for each of the plurality of model expressions, wherein the range of the residual term is a range of residuals for values of the output evaluation indicators, which are calculated by a model expression including the residual term;

first causing, by using the computer, a processing unit configured to calculate a feasible region by a quantifier elimination method to calculate a first feasible region for the first problem and a second feasible region for the second problem to obtain first data of the first feasible region and second data of the second feasible region;

superimposing, by using the computer, the first feasible region and the second feasible region based on the first data and the second data; and displaying, by using the computer and on a display device, the first feasible region and the second feasible region which have been superimposed.

6. The method as set forth in claim 5, further comprising:

second generating, by using the computer and from the data of the plurality of model expressions, a third problem to calculate a third region that is a feasible with the plurality of model expressions and the value ranges of the input parameters; and second causing, by using the computer, the processing unit to calculate a third feasible region for the third problem to obtain third data of the third feasible region, and wherein the superimposing comprises superimposing the first feasible region, the second feasible region and the third feasible region, and the displaying comprises displaying, on the display device, the first feasible region, the second feasible region and the third feasible region which have been superimposed.

7. The method as set forth in claim 5, further comprising:

calculating, by using the computer, the values of the output evaluation indicators by substituting specific values of the input parameters into each of the plurality of model expressions; and identifying, by using the computer and for each of the plurality of model expressions, the range of the residual term by calculating residuals between measurement values of the output evaluation indicators for the specific values of the input parameters and the calculated values of the output evaluation indicators.

8. The method as set forth in claim 5, further comprising accepting an input of the data of the range of the residual term from a user.

9. A visualization processing apparatus, comprising:

a memory; and a processor configured to use the memory and execute a process, the process comprising:

first generating, from data of a plurality of model expressions, each including a residual term and representing a relationship between input parameters and output evaluation indicators, and data of a range of the residual term for each of the plurality of model expressions, a first problem to calculate a first region that is capable of being feasible with the plurality of model expressions, value ranges of the input parameters and the range of the residual term for each of the plurality of model expressions and a second problem to calculate a second region that is always feasible with the plurality of model expressions, the value ranges of the input parameters and influence of the range of the residual term for each of the plurality of model expressions, wherein the range of the residual term is a range of residuals for values of the output evaluation indicators, which are calculated by a model expression including the residual term;

first causing a processing unit configured to calculate a feasible region by a quantifier elimination method to calculate a first feasible region for the first problem and a second feasible region for the second problem to obtain first data of the first feasible region and second data of the second feasible region;

superimposing the first feasible region and the second feasible region based on the first data and the second data; and displaying, on a display device, the first feasible region and the second feasible region which have been superimposed.

10. The visualization processing apparatus as set forth in claim 9, wherein the process further comprises:

second generating, from the data of the plurality of model expressions, a third problem to calculate a third region that is a feasible with the plurality of model expressions and the value ranges of the input parameters; and second causing the processing unit to calculate a third feasible region for the third problem to obtain third data of the third feasible region, the superimposing comprises superimposing the first feasible region, the second feasible region and the third feasible region based on the first data, the second data and the third data, and the displaying comprises displaying, on the display device, the first feasible region, the second feasible region and the third feasible region which have been superimposed.

11. The visualization processing apparatus as set forth in claim 9, wherein the process further comprises:

calculating the values of the output evaluation indicators by substituting specific values of the input parameters into each of the plurality of model expressions; and identifying, for each of the plurality of model expressions, the range of the residual term by calculating residuals between measurement values of the output evaluation indicators for the specific values of the input parameters and the calculated values of the output evaluation indicators.

12. The visualization processing apparatus as set forth in claim 9, wherein the process further comprises accepting an input of the data of the range of the residual term from a user.

* * * * *